United States Patent
Jung et al.

(10) Patent No.: US 11,706,962 B2
(45) Date of Patent: Jul. 18, 2023

(54) DISPLAY DEVICE

(71) Applicant: LG Display Co., Ltd., Seoul (KR)

(72) Inventors: Kyoung-June Jung, Goyang-si (KR);
Jinwoo Park, Goyang-si (KR);
ChungWan Oh, Paju-si (KR);
Gayoung Kim, Daejeon (KR)

(73) Assignee: LG Display Co., Ltd., Seoul (KR)

( * ) Notice: Subject to any disclaimer, the term of this patent is extended or adjusted under 35 U.S.C. 154(b) by 210 days.

(21) Appl. No.: 16/545,698

(22) Filed: Aug. 20, 2019

(65) Prior Publication Data
US 2020/0058729 A1 Feb. 20, 2020

(30) Foreign Application Priority Data

Aug. 20, 2018 (KR) .................. 10-2018-0096619

(51) Int. Cl.
*H10K 59/131* (2023.01)
*H10K 59/122* (2023.01)
(Continued)

(52) U.S. Cl.
CPC ....... *H10K 59/1315* (2023.02); *H10K 59/122* (2023.02); *H10K 59/124* (2023.02);
(Continued)

(58) Field of Classification Search
CPC ............. H01L 27/3279; H01L 27/3276; H01L 27/3246; H01L 27/3258; H01L 2251/558; H01L 2251/5392; H01L 51/5237; H01L 27/3244; H01L 51/56; H01L 2251/56; H10K 59/1315; H10K 59/122;
(Continued)

(56) References Cited

U.S. PATENT DOCUMENTS 9,257,494 B2   2/2016   Park et al.
9,406,736 B2   8/2016   Park et al.
(Continued)

FOREIGN PATENT DOCUMENTS

CN    104218061 A      12/2014
GB       2509844 A  *   7/2014    ........... H01L 27/124
(Continued)

OTHER PUBLICATIONS

Korean Intellectual Property Administration, Office Action, KR Patent Application No. 10-2018-0096619, dated Mar. 2, 2023, 10 pages.
(Continued)

*Primary Examiner* — Hoang-Quan Ho
(74) *Attorney, Agent, or Firm* — Fenwick & West LLP

(57) ABSTRACT

Provided is a display device. The display device includes: one or more pixels placed in an active area and a pixel circuit associated with the pixels; and a power supply line placed in an inactive area outside the active area and connected to the pixel circuit. At least one side of the power supply line may be covered with an overcoating layer. The overcoating layer includes a first portion adjacent to the side of the power supply line and a second portion which is farther from the power supply line than the first portion. The first portion has a smaller thickness than the second portion. The first portion may be about half the thickness of the second portion.

13 Claims, 4 Drawing Sheets

(51) Int. Cl.
*H10K 59/124* (2023.01)
*H10K 102/00* (2023.01)

(52) U.S. Cl.
CPC ..... *H10K 59/131* (2023.02); *H10K 2102/341* (2023.02); *H10K 2102/351* (2023.02)

(58) Field of Classification Search
CPC ............... H10K 59/124; H10K 59/131; H10K 2102/341; H10K 2102/351; H10K 59/87; H10K 59/12; H10K 50/84; H10K 71/00
See application file for complete search history.

(56) References Cited

U.S. PATENT DOCUMENTS

| | | | |
|---|---|---|---|
| 2009/0058280 A1* | 3/2009 | Jo | H01L 27/3276 313/504 |
| 2012/0097940 A1 | 4/2012 | Kwon et al. | |
| 2012/0119235 A1* | 5/2012 | Nishiyama | H05B 33/10 257/88 |
| 2014/0353619 A1 | 12/2014 | Park et al. | |
| 2015/0090983 A1* | 4/2015 | Ozawa | H01L 27/3279 257/40 |
| 2015/0144922 A1* | 5/2015 | Moon | H01L 27/3279 257/40 |
| 2016/0099298 A1 | 4/2016 | Park et al. | |
| 2017/0345847 A1 | 11/2017 | Kim et al. | |
| 2019/0229177 A1* | 7/2019 | Kim | G09G 3/3208 |
| 2020/0365681 A1* | 11/2020 | Gunji | H05B 33/06 |

FOREIGN PATENT DOCUMENTS

| | | |
|---|---|---|
| KR | 10-2012-0025505 A | 3/2012 |
| KR | 10-2013-0072125 A | 7/2013 |
| KR | 10-2015-0061756 A | 6/2015 |

OTHER PUBLICATIONS

China National Intellectual Property Administration, Office Action, CN Patent Application No. 201910768439.1, dated Mar. 21, 2023, 14 pages.

* cited by examiner

DISPLAY DEVICE

CROSS-REFERENCE TO RELATED APPLICATION

This application claims the priority of Republic of Korea Patent Application No. 10-2018-0096619 filed on Aug. 20, 2018, which is incorporated herein by reference in its entirety.

BACKGROUND

Field

The present disclosure relates to a display device.

Description of the Related Art

As a core technology in the information communication era, image display devices for implementing various information on a screen thereof have been developed in the direction of high performance while allowing thinner, lighter and portable devices. Accordingly, an organic light-emitting display device or the like for controlling the light-emitting amount of an organic light-emitting diode (OLED) to display an image has been widely used.

The OLED is a self-emission element using a thin light-emitting layer between electrodes and can be thinned. A typical organic light-emitting display device has a structure in which pixel driving circuits and OLEDs are formed on a substrate, and an image is displayed while light emitted from the OLEDs passes through the substrate or a barrier layer.

In recent years, various display devices including the organic light-emitting display device have become smaller and/or thinner for aesthetic reasons and in response to various consumer needs. Also, a bezel outside an active area has been reduced in width. Accordingly, the design of an outer periphery of the active area has been changed such that a large number of components can be accommodated in a narrow area. Whenever a side effect caused by the integrated design has been found, a countermeasure therefor has been studied.

SUMMARY

An object to be achieved by the present disclosure is to provide a structure that can suppress short between metal layers which may occur in an outer periphery of a display device.

Objects of the present disclosure are not limited to the above-mentioned objects, and other objects, which are not mentioned above, can be clearly understood by those skilled in the art from the following descriptions.

According to an aspect of the present disclosure, a display device is provided. The display device includes: one or more pixels placed in an active area and a pixel circuit associated with the one or more pixels; and a power supply line placed in an inactive area outside the active area and connected to the pixel circuit. At least one side of the power supply line may be covered with an overcoating layer. The overcoating layer includes a first portion adjacent to the side of the power supply line and a second portion which is farther from the power supply line than the first portion. The first portion has a smaller thickness than the second portion. The first portion may be half the thickness of the second portion.

The overcoating layer may be placed in both the active area and the inactive area. The overcoating layer may expose at least a part of the power supply line. The first portion may be prepared using a half-tone mask or a slit mask.

The display device may further include a first metal layer placed on the power supply line, and the power supply line and the first metal layer may be in contact with each other. The first metal layer may be located on the first portion and not be located on the second portion. The first metal layer may be prepared using the same material as an anode electrode included in the pixel circuit.

The display device may further include a bank on the overcoating layer and the first metal layer, and a second metal layer on the bank. The second metal layer may be prepared using the same material as a cathode electrode included in the pixel circuit. The bank may have a thickness to suppress contact between the first metal layer and the second metal layer, on the first metal layer.

The power supply line may be prepared using the same material as a source electrode or a drain electrode of a thin film transistor (TFT) included in the pixel circuit. The power supply line may have a multi-layered structure in which titanium (Ti), aluminum (Al), and titanium (Ti) are sequentially laminated. The power supply line may be a high-potential power supply ($V_{DD}$) line, an initialization power supply line, or a low-potential power supply ($V_{SS}$) line.

Other detailed matters of the exemplary embodiments are included in the detailed description and the drawings.

According to the present disclosure, it is possible to provide a display device in which the degradation of image quality or reliability caused by a short between lines is improved. Further, according to exemplary embodiments of the present disclosure, it is possible to provide a structure that can suppress the loss of a bank from an outer periphery of the display device.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings.

DETAILED DESCRIPTION

Figure 1:
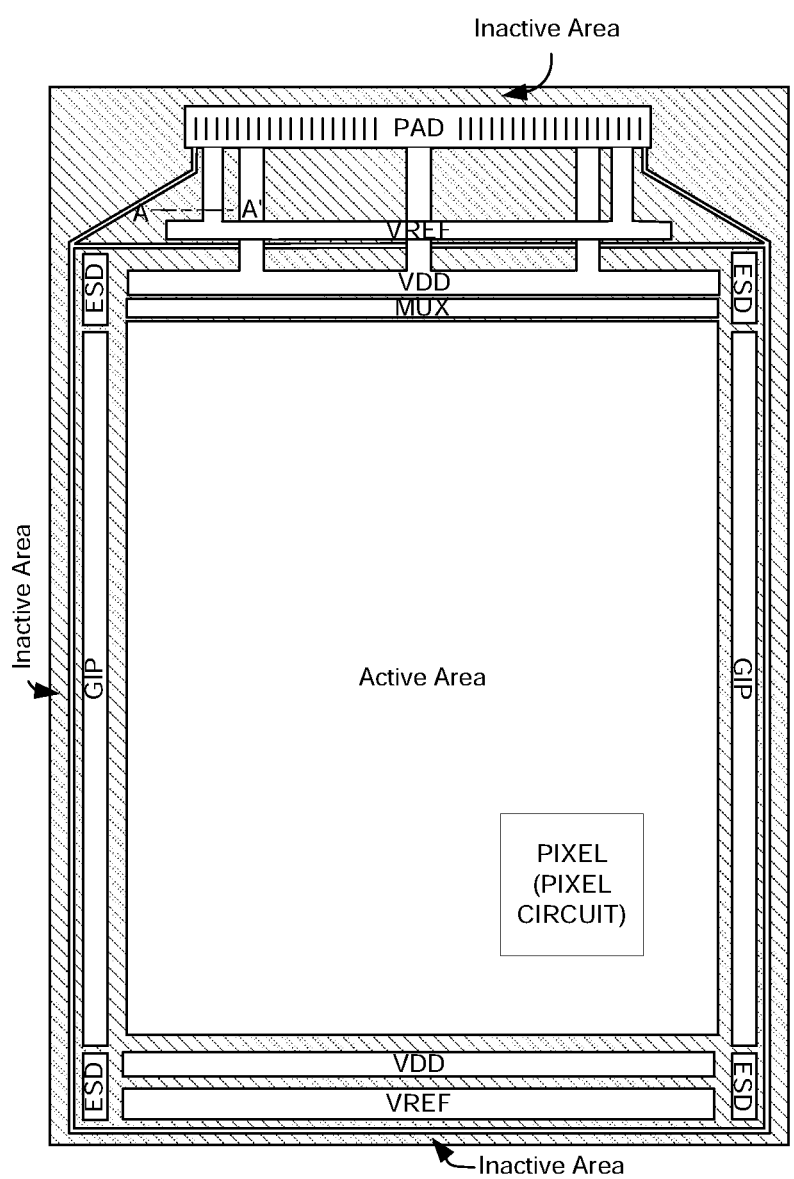
FIG. 1 illustrates an exemplary display device which can be included in an electronic device.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present invention will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

FIG. 1 illustrates an exemplary display device which can be included in an electronic device.

Referring to FIG. 1, a display device 100 includes at least one active area. In the active area, an array of pixels is formed. At least one inactive area may be placed around the active area. That is, the inactive area may be adjacent to at least one side of the active area. FIG. 1 illustrates that the inactive area surrounds the active area having a rectangular shape. However, the shape of the active area, the shape/layout of the inactive area adjacent to the active area are not limited to the example as illustrated in FIG. 1. The active area and the inactive area may be designed suitable for an electronic device equipped with the display device 100. The active area may be, for example, pentagonal, hexagonal, circular, oval, and the like.

Each pixel in the active area may be associated with a pixel circuit. The pixel circuit may include at least one switching transistor and at least one driving transistor on a backplane. Each pixel circuit may be electrically connected to a gate line and a data line for communication with at least one driving circuit, such as a gate driver and a data driver, located in the inactive area.

The driving circuit may be implemented as a thin film transistor (TFT) in the inactive area, as shown in FIG. 1. The driving circuit may be referred to as gate-in-panel (GIP). Further, some components, such as a data driver IC, may be mounted on a separate printed circuit board. The components may be coupled to a connection interface (e.g., pad, bump, pin, etc.) disposed in the inactive area by circuit films such as a flexible printed circuit board (FPCB), a chip-on-film (COF), and a tape-carrier-package (TCP). The inactive area may be bent together with the connection interface so that the printed circuit (e.g., COF, PCB, etc.) may be positioned on the rear side of the display device 100.

The display device 100 may include various additional components for generating various signals or driving pixels in the active area. The additional components for driving pixels may include an inverter circuit, a multiplexer (MUX), an electrostatic discharge circuit (ESD), etc. The display device 100 may also include additional components associated with functions other than the pixel driving function. For example, the display device 100 may include additional components for providing a touch sensing function, a user authentication function (e.g., fingerprint recognition), a multilevel pressure sensing function, a tactile feedback function, etc. The above-mentioned additional components may be located in the inactive area and/or an external circuit connected to the connection interface.

At least one edge of the display device 100 may be bent away from a central portion of the display device 100. Since at least one part of the display device 100 is bendable, the display device 100 can be substantially defined as a flat portion and a bended portion. That is, one part (e.g., a line part between a pad and the active area) of the display device 100 can be bent at a predetermined angle and may be referred to as a bended portion. The bended portion includes a bended section which is actually bent with a predetermined bending radius. The display device 100 includes usually, but not always, a substantially flat central portion and a bendable edge portion.

When the inactive area is bent, the inactive area is not visible or is minimally visible from the front of the display device. A part of the inactive area which is visible from the front of the display device may be obstructed by a bezel. The bezel may be formed as an independent structure or housing or other appropriate components. The part of the inactive area which is visible from the front of the display device may be hidden below an opaque mask layer made of black ink (e.g., a polymer which is filled with carbon black). The opaque mask layer may be provided on various layers (e.g., a touch sensing layer, a polarizing layer, a cover layer, etc.) included in the display device 100.

The bended portion can be bent outwards from the central portion at a bending angle θ with a bending radius R with respect to a bending axis. The sizes of the respective bended portions may not be the same. Further, the bending angle θ of the circumference of the bending axis and the radius R of curvature from the bending axis may be different in each bended portion.

Figure 2A:
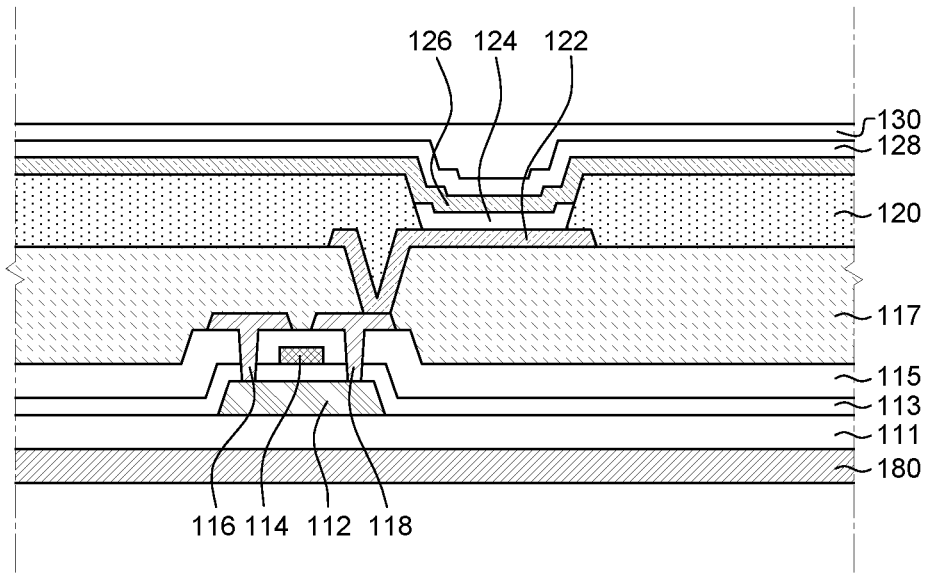
FIG. 2A and FIG. 2B are schematic cross-sectional views of an active area and an inactive area of a display device according to an embodiment of the present disclosure.
Figure 2B:
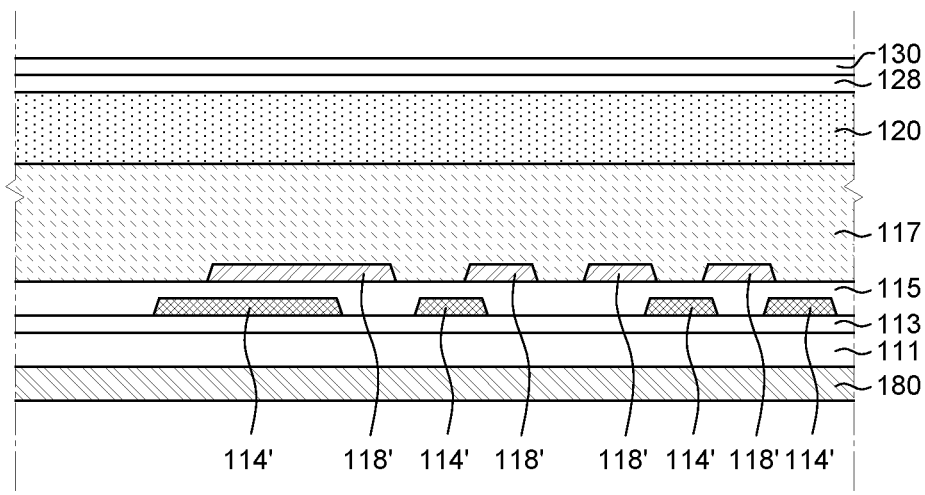

FIG. 2A and FIG. 2B are schematic cross-sectional views of an active area and an inactive area of a display device according to an embodiment of the present disclosure.

The illustrated active area and inactive area may be applied to at least a part of the active area A/A and the inactive area I/A illustrated in FIG. 1. Hereafter, an organic light-emitting display device will be described as an example of the display device.

As for the organic light-emitting display device, TFTs 112, 114, 116, and 118, OLEDs 122, 124, and 126, and various functional layers are located on a base layer 111 in the active area. Meanwhile, various driving circuits, electrodes, lines, and functional structures may be located on the base layer 111 in the inactive area.

The base layer 111 supports various components of the organic light-emitting display device 100. The base layer 111 may be formed of a transparent insulating material such as glass, plastic, or the like. A substrate (i.e., an array substrate) may also be considered as including components and functional layers, e.g., a switching TFT, a driving TFT, an OLED, and a passivation layer, formed thereon.

A buffer layer may be located on the base layer 111. The buffer layer is a functional layer for protecting the TFT against impurities such as alkali ions or the like flowing out from the base layer 111 or other lower layers. The buffer layer may be formed of silicon oxide (SiOx), silicon nitride (SiNx), or a multilayer thereof.

The TFT is placed on the base layer 111 or the buffer layer. The TFT may have a structure in which a semiconductor layer 112, a gate insulating film 113, a gate electrode 114, an interlayer insulating film 115, and source and drain electrodes 116 and 118 are sequentially laminated. The semiconductor layer 112 is located on the base layer 111 or the buffer layer. The semiconductor layer 112 may be made of polysilicon (p-Si), and in this case, a predetermined area may be doped with an impurity. Further, the semiconductor layer 112 may be made of amorphous silicon (a-Si) or may be made of various organic semiconductor materials such as pentacene. Furthermore, the semiconductor layer 112 may be made of an oxide material. The gate insulating film 113 may be formed of an insulating inorganic material such as silicon oxide (SiOx) or silicon nitride (SiNx) or may be formed of an insulating organic material. The gate electrode 114 may be formed of various conductive materials such as magnesium (Mg), aluminum (Al), nickel (Ni), chromium (Cr), molybdenum (Mo), tungsten (W), gold (Au), or an alloy thereof.

The interlayer insulating film 115 may be formed of an insulating material such as silicon oxide (SiOx) or silicon nitride (SiNx) or may be formed of an insulating organic material or the like. A contact hole, through which source and drain regions are exposed, may be formed by selectively removing the interlayer insulating film 115 and the gate insulating film 113.

The source and drain electrodes 116 and 118 are formed of an electrode material on the interlayer insulating film 115 as a single layer structure or a multi-layered structure.

An overcoating layer 117 may be located on the TFT. The overcoating layer 117 protects the TFT and flattens the upper portion thereof. The overcoating layer 117 may be formed in various shapes and may be formed as an organic insulating layer such as benzocyclobutene (BCB) or acryl or an inorganic insulating layer such as a silicon nitride film (SiNx) or a silicon oxide film (SiOx). Also, the overcoating layer 117 may be a single layer, or a double layer or a multilayer, and may have various modifications.

The OLED may have a structure in which a first electrode 122, an organic light-emitting layer 124, and a second electrode 126 are sequentially laminated. That is, the OLED may include the first electrode 122 on the overcoating layer 117, the organic light-emitting layer 124 on the first electrode 122, and the second electrode 126 on the organic light-emitting layer 124.

The first electrode 122 may be electrically connected to the drain electrode 118 of the driving TFT through the contact hole. If the organic light-emitting display device 100 is of a top-emission type, the first electrode 122 may be made of an opaque conductive material having a high reflectivity. For example, the first electrode 122 may be formed of silver (Ag), aluminum (Al), gold (Au), molybdenum (Mo), tungsten (W), chromium (Cr), or an alloy thereof.

The bank 120 may be formed in the remaining region except for a light-emitting region. Accordingly, the bank 120 has a bank hole that exposes the first electrode 122 corresponding to the light-emitting region. The bank 120 may be made of an inorganic insulating material such as a silicon nitride film (SiNx), a silicon oxide film (SiOx), or an organic insulating material such as BCB, acrylic-based resin or imide-based resin.

The organic light-emitting layer 124 is located on the first electrode 122 which is exposed by the bank 120. The organic light-emitting layer 124 may include a light emitting layer, an electron injection layer, an electron transport layer, a hole transport layer, a hole injection layer, and the like. The organic light-emitting layer 124 may have a structure of a single light-emitting layer that emits a single light or a structure of a plurality of light-emitting layers that emits white light.

The second electrode 126 is located on the organic light-emitting layer 124. If the organic light-emitting display device 100 is of a top-emission type, the second electrode 126 may be formed of a transparent conductive layer such as indium tin oxide (ITO) or indium zinc oxide (IZO). Thus, light generated from the organic light-emitting layer 124 is emitted toward an upper side of the second electrode 126.

A passivation layer 128 and an encapsulation layer 130 are located on the second electrode 126. The passivation layer 128 and the encapsulation layer 130 are configured to suppress the permeation of oxygen and moisture from the outside to suppress the oxidation of a light-emitting material and an electrode material. When the OLED is exposed to moisture or oxygen, pixel shrinkage which is a reduction of the light-emitting region may occur or a dark spot may be generated in the light-emitting region. The passivation layer and/or the encapsulation layer may be formed as an inorganic layer of glass, metal, aluminum oxide (AlOx) or silicon (Si)-based material. Otherwise, the passivation layer and/or the encapsulation layer may have a structure in which an organic layer and an inorganic layer may be alternately laminated. The inorganic layer serves to block permeation of moisture or oxygen, and the organic layer serves to flatten the surface of the inorganic layer. The encapsulation layer may be formed as a plurality of thin films. This is because the plurality of thin films increases and complicates a permeation path of moisture or oxygen as compared with a single layer, which makes it difficult for moisture/oxygen to permeate into the OLED.

The organic light-emitting display device 100 may further include a touch layer, a polarizing layer, and a cover layer on the encapsulation layer 130. A touch panel/touch sensing electrode for sensing a user's touch input may be provided on an upper surface of the OLED (e.g., an upper surface of the encapsulation layer). A separate layer including a touch sensing electrode and/or other components associated with a touch-input sensing function may be provided within the display device 100. The touch sensing electrode (e.g., a touch driving/sensing electrode) may be formed of a transparent conductive material such as an indium tin oxide material, carbon-based materials such as graphene, carbon nanotube, a conductive polymer, a hybrid material made of a mixture of various conductive and non-conductive materials. Further, a metal mesh such as an aluminum mesh or a silver mesh can also be used as the touch sensing electrode.

The display device 100 may include the polarizing layer to control display characteristics (e.g., external light reflection, color accuracy, and luminance). The cover layer may be used to protect the display device 100, and may be, for example, a cover glass.

To increase the strength and/or the rigidity of a specific portion in the display device 100, at least one support layer 180 may be provided under the base layer 111. The support layer 180 is bonded to a surface (second surface) of the base layer 111 opposite to a surface (first surface) on which the OLED is disposed. The support layer 180 may be formed as a thin plastic film of polyethylene naphthalate (PEN), polyethylene terephthalate (PET), polyethylene ether phthalate, polycarbonate, polyarylate, polyether imide, polyether sulfonate, polyimide, polyacrylate, or another suitable combination of polymers. Other suitable materials that may be used to form the support layer 180 may include a thin glass, a metal foil covered with a dielectric material, a multi-layered polymer, and a polymer film containing a polymer material combined with nanoparticles or micro-particles.

To facilitate easier bending and to enhance the reliability of the display device 100, the configuration of components in the bended portion may differ from the flat central portion. Some of the components in the central portion may not be disposed in the bended portion or may be provided in a different thickness. For example, the bended portion may be free of the support layer 180, the polarizing layer, the touch sensing layer, a color filter layer and/or other components that may hinder bending of the display device 100. Further, OLEDs may be provided in different forms in consideration of a viewing angle of the bended portion.

In the inactive area I/A, no pixel circuit is disposed but the base layer 111 and the organic and inorganic functional layers 113, 115, 117, 128, 130, etc. may be present. Further, in the inactive area I/A, materials used for forming the active area A/A may be disposed for other uses. For example, as shown in FIG. 2B, a metal 114' used as a gate electrode of the TFT in the active area or a metal 118' used as a source/drain electrode may be disposed as a line or an electrode in the inactive area I/A. Furthermore, a metal 122' used as an electrode (e.g., an anode) of the OLED may also be disposed as a line or an electrode in the inactive area I/A.

Figure 3:
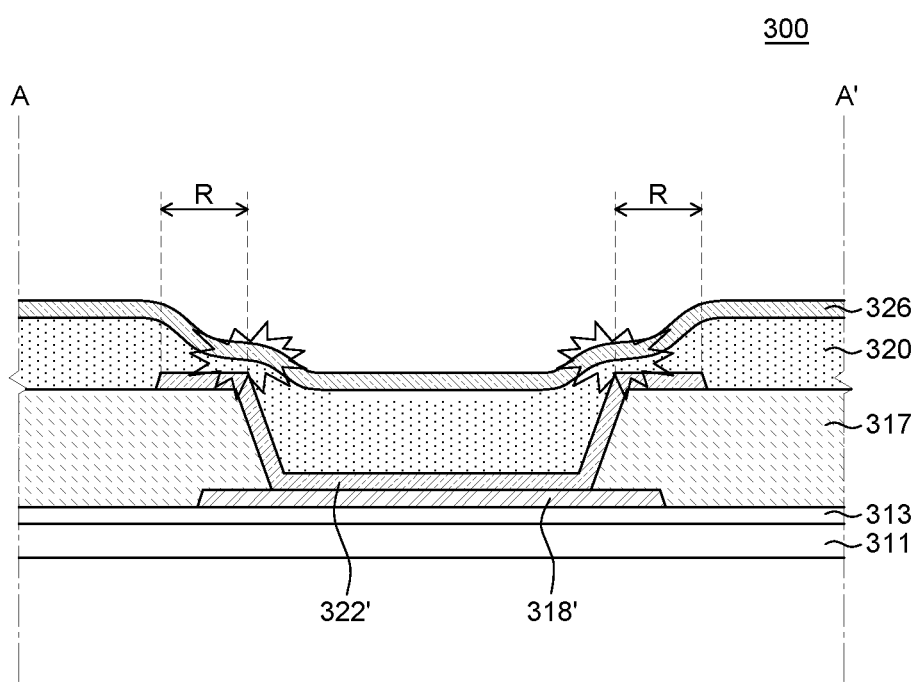
FIG. 3 illustrates an example layout of a line in a display device.

FIG. 3 shows an example of a power supply line of a display device.

FIG. 3 is a cross-sectional view of a portion A-A' of the display device shown in FIG. 1. For the convenience of description, FIG. 3 simply illustrates only a power supply line layer 318', an overcoating layer 317, and metal layers 322' and 326 of a display device.

Referring to FIG. 1, the power supply line 318' is an initialization power supply ($V_{REF}$) line. However, the following description may be applied even to a case where the power supply line 318' is a $V_{DD}$ line or a $V_{SS}$ line. The power supply line 318' may be formed of the same metal on the same layer as a source or drain electrode of a TFT in an active area (e.g., a pixel circuit). The power supply line 318' may be prepared using the same material as a source electrode or a drain electrode of a TFT included in the pixel circuit. FIG. 3 illustrates the overcoating layer 317 on the power supply line 318', which is just an example. Another insulating layer may be placed on the power supply line 318'.

In the layout of a line unit shown in FIG. 3, the overcoating layer 317 is not present in a specific region, e.g., a partial region on the power supply line 318'. This means that a part of the overcoating layer is cut off to suppress the spread of moisture which may occur along an organic layer forming the overcoating layer 317.

A first metal layer 322' may be located on the power supply line 318'. The first metal layer 322' may be formed of the same metal as the first electrode (e.g., the anode electrode) of the OLED shown in FIG. 2A.

The overcoating layer 317 is formed on the entire active and inactive areas, and a specific portion thereof may be removed depending on the design. Further, the first metal layer 322' is placed on the overcoating layer 317.

In the active area, the first electrode may be separated for each pixel. However, in the inactive area, there may be no need for the first electrode (i.e., the first metal layer). Thus, conventionally, the first metal layer 322' in the inactive area has been removed. However, while the first metal layer 322' is removed, a residue of the first metal layer 322' remains. Further, it has been found that such a residue causes various problems (e.g., cracks, or the like). The design of leaving the first metal layer 322' in the inactive area as shown in FIG. 3 has been introduced. The first metal layer 322' left in the inactive area as shown in FIG. 3 may positively function to reduce a resistance of the power supply line 318' by a certain amount.

A bank 320 covers an upper part of the overcoating layer 317. The bank 320 exposes a part of the first electrode in the active area as shown in FIG. 2A and fully covers the first metal layer 322' in the inactive area.

A second metal layer 326 may be located on the bank 320. The second metal layer 326 may be formed of the same metal as the second electrode (e.g., the cathode electrode) of the OLED shown in FIG. 2A. Unlike the first metal layer 322', the second metal layer 326 may be formed on the entire active and inactive areas.

However, the above-described structure of the line unit has some weaknesses. One of them is a short between the first metal layer 322' and the second metal layer 326. According to studies, the short usually occurs when the first metal layer 322' on the overcoating layer 317 is in contact with the second metal layer 326, which is caused by a reduced thickness of the bank 320 in a corresponding portion R.

In general, the bank 320 includes a spacer at a specific position thereon. The spacer refers to a structure that suppresses contact of a mask with a display device during a process. A portion protruded by patterning the bank is typically used as the spacer. That is, an upper part of the bank is removed sparsely, and an unremoved portion can be used as the spacer.

When the spacer is formed, a photo process is performed. The bank 320 in the corresponding portion R may be exposed due to reflective light from the first metal layer 322' on the overcoating layer 317. Accordingly, the bank in the corresponding portion R is further etched during an etching process for forming the spacer and thus reduced in thickness. Further, the bank having a smaller thickness than the other portions may eventually cause contact between the first metal layer 322' and the second metal layer 326.

The present disclosure provides a structure that can suppress contact between the first metal layer 322' and the second metal layer 326.

Figure 4:
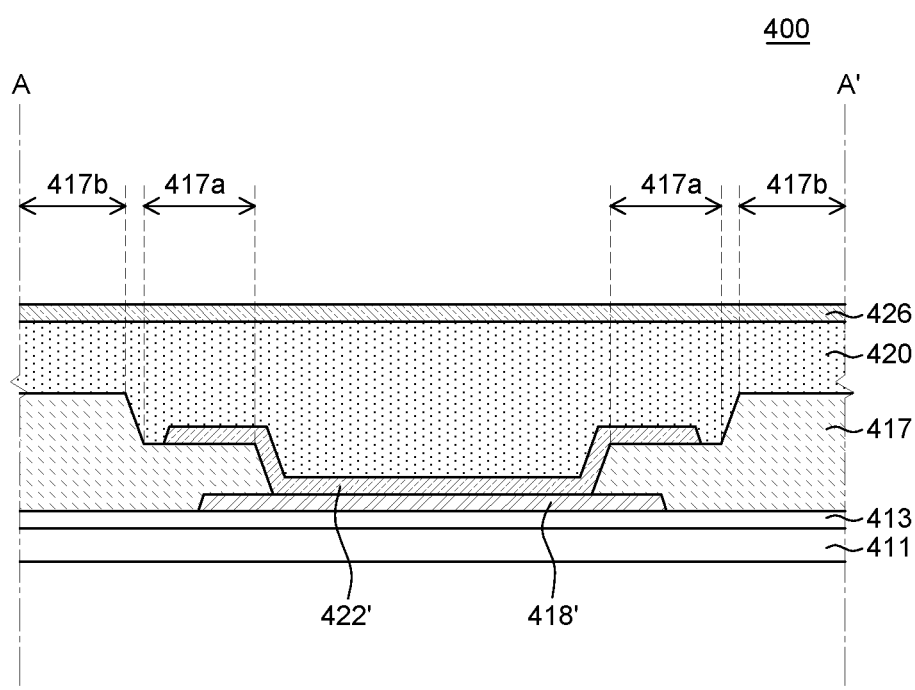
FIG. 4 illustrates a display device according to an embodiment of the present disclosure.

FIG. 4 illustrates a display device according to an embodiment of the present disclosure.

FIG. 4 is an enlarged view of the portion A-A' of FIG. and shows an example where the line unit has a modified structure. For the convenience of description, FIG. 4 simply illustrates only a line 418', an organic layer 417, and metal layers 422' and 426 of a display device, but does not illustrate upper functional layers (e.g., an encapsulation layer). The display device shown in FIG. 4 includes substantially the same components as illustrated in FIG. 1 and FIG. 2 except specific structures to be described below.

The power supply line 418' may be a $V_{REF}$ line, a $V_{DD}$ line, or a $V_{SS}$ line. The power supply line 418' is extended from a connection interface (e.g., pad, pin, etc.) in a pad area P toward an active area. The power supply line 418' may be formed of the same metal on the same layer as a source or drain electrode of a TFT in the active area (e.g., a pixel circuit). The power supply line 418' may have a multi-layered structure in which titanium (Ti), aluminum (Al), and titanium (Ti) are sequentially laminated. FIG. 4 illustrates the overcoating layer 417 on the power supply line 418', which is just an example. Another insulating layer may be placed on the power supply line 418'.

In the layout of the line unit shown in FIG. 4, the overcoating layer 417 is not present in a specific region, e.g., a partial region on the power supply line 418'. This means that a part of the overcoating layer is cut off to suppress the spread of moisture which may occur along an organic layer forming the overcoating layer 417.

The display device shown in FIG. 4 has a structure in which a bank is controlled not to be excessively thin to solve the above-described problem with reference to FIG. 3. Thus, the display device 400 according to an embodiment of the present disclosure includes the overcoating layer 417 whose height at a contact portion with a first metal layer 422' is adjusted.

The display device 400 may include one or more pixels placed in the active area and a pixel circuit associated with the pixels; and the power supply line 418' placed in an inactive area outside the active area and connected to the pixel circuit. At least one side of the power supply line 418' may be covered with the overcoating layer 417. In an embodiment, the overcoating layer 417 may include a first portion 417a adjacent to the side of the power supply line 418' and a second portion 417b which is farther from the power supply line 418' than the first portion 417a. The first portion 417a may have a smaller thickness than the second portion 417b. Herein, the thickness of the overcoating layer may be the height of the overcoating layer 417 measured from a lower layer 413. For example, the first portion 417a may be about half the thickness of the second portion 417b.

The overcoating layer 417 is provided in both the active area and the inactive area. Herein, the overcoating layer 417 may be provided in both the active area and the inactive area through the same coating process. Meanwhile, the overcoating layer 417 exposes at least a part of the power supply line 418'. For example, as shown in FIG. 4, the overcoating layer 417 may expose a central portion of the power supply line 418'. A lower layer can be exposed by the overcoating layer through the above-described patterning process (e.g., photo process, etching process, etc.). Particularly, as in an embodiment illustrated in FIG. 4, the overcoating layer 417 having two or more different thicknesses (heights) may be formed using a half-tone mask, a slit mask, or the like. For example, the first portion 417a having a relatively smaller thickness (height) may be formed corresponding to a half-tone or slit region of a mask. Also, the second portion 417b having a relatively greater thickness (height) may be formed correspondingly to a full-tone or slitless region of the mask.

A bank 420 is placed on the overcoating layer 417 and the first metal layer 422', and a second metal layer 426 is located on the bank 420. The second metal layer 426 may be formed of the same material as a cathode electrode included in the pixel circuit.

In an embodiment, the first metal layer 422' is placed on the power supply line 418', and the power supply line 418' and the first metal layer 422' are in contact with each other. The first metal layer 422' may be formed of the same material as an anode electrode included in the pixel circuit. The first metal layer 422' is located on the first portion 417a, but is not located on the second portion 417b. Such layout is consistent with consideration of the loss of the bank on the first metal layer 422' caused by light reflection from the first metal layer 422' during a process (particularly, photo process) for forming a spacer. That is, if the overcoating layer on which the first metal layer 422' is placed has a small thickness, the bank on the first metal layer 422' is relatively increased in thickness. Thus, even if the loss of the bank occurs due to reflection, contact between the first metal layer 422' and the second metal layer 426 as shown in FIG. 3 can be suppressed. Thus, the bank 420 has a thickness sufficient to suppress the contact between the first metal layer 422' and the second metal layer 426, on the first metal layer 422'. In an embodiment, the above-described defect can be improved when the first portion 417a has a thickness of about 1 μm and the second portion 417b has a thickness of about 2 μm.

According to the above-described embodiment, it is possible to provide a display device in which contact between the first metal layer 422' and the second metal layer 426 in an outer periphery and low image quality problem caused by connection between the power supply line 422' and the second metal layer 426 can be solved.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
   one or more pixels placed in an active area and a pixel circuit associated with the one or more pixels;
   a power supply line placed in an inactive area outside the active area and connected to the pixel circuit;
   a first metal layer placed on the power supply line;
   an overcoating layer covering at least one side of the power supply line; and
   a bank on the overcoating layer and the first metal layer,
   wherein:
   the overcoating layer includes a first portion adjacent to the at least one side of the power supply line and a second portion which is farther from the power supply line than the first portion,
   the first portion of the overcoating layer has a smaller thickness than the second portion of the overcoating layer so that an upper surface of the first portion of the overcoating layer and an upper surface of the second portion of the overcoating layer form a step, both the first portion and the second portion of the overcoating layer being of a same organic material, the power supply line and the first metal layer are in contact with each other, at least one side of the first metal layer is located on the first portion, and the bank includes a first part in contact with the first metal layer corresponding to the first portion of the overcoating layer and a second part in contact with the second portion of the overcoating layer, the first part of the bank having a greater thickness than the second part of the bank.

2. The display device according to claim 1, wherein the overcoating layer is placed in both the active area and the inactive area.

3. The display device according to claim 2, wherein the overcoating layer exposes at least a part of the power supply line.

4. The display device according to claim 1, wherein the first metal layer is prepared using a same material as an anode electrode included in the pixel circuit.

5. The display device of claim 1, further comprising:
a second metal layer on the bank.

6. The display device according to claim 5, wherein a material of the second metal layer is associated with a material of a cathode electrode included in the pixel circuit.

7. The display device according to claim 5, wherein the bank has a thickness to suppress contact between the first metal layer and the second metal layer, on the first metal layer.

8. The display device according to claim 1, wherein a material of the power supply line is associated with a material of a source electrode or a drain electrode of a thin film transistor (TFT) included in the pixel circuit.

9. The display device according to claim 1, wherein the power supply line comprises a multi-layered structure in which titanium (Ti), aluminum (Al), and titanium (Ti) are sequentially laminated.

10. The display device according to claim 1, wherein the first portion is prepared using a half-tone mask or a slit mask.

11. The display device according to claim 1, wherein the power supply line is associated with at least one of a high-potential power supply ($V_{DD}$) line, an initialization power supply line, and a low-potential power supply ($V_{SS}$) line.

12. The display device according to claim 1, wherein the first portion is half a thickness of the second portion.

13. The display device according to claim 1, wherein the first portion and the second portion of the overcoating layer are formed as a single-layer.

* * * * *